United States Patent
Wall et al.

(10) Patent No.: US 7,973,449 B2
(45) Date of Patent: Jul. 5, 2011

(54) TRANSDUCER FOR SURFACE ACOUSTIC WAVES AND A RESONATOR AND A FILTER HAVING SAID TRANSDUCER

(75) Inventors: Bert Wall, Potsdam (DE); Bernd Steiner, Rangsdorf (DE); Guenter Martin, Dresden (DE); Sergey V. Biryukov, Bannewitz (DE)

(73) Assignee: Vectron International GmbH & Co. KG, Teltow (DE)

( * ) Notice: Subject to any disclaimer, the term of this patent is extended or adjusted under 35 U.S.C. 154(b) by 313 days.

(21) Appl. No.: 12/338,264

(22) Filed: Dec. 18, 2008

(65) Prior Publication Data

US 2009/0161490 A1 Jun. 25, 2009

(30) Foreign Application Priority Data

Dec. 20, 2007 (DE) .......................... 10 2007 063 470

(51) Int. Cl.
*H03H 9/25* (2006.01)
*H01L 41/08* (2006.01)

(52) U.S. Cl. .................................... 310/313 B; 333/193
(58) Field of Classification Search .................... 310/313
See application file for complete search history.

(56) References Cited

U.S. PATENT DOCUMENTS

| 3,990,023 A | 11/1976 | Kodama |
| 4,670,681 A | 6/1987 | Wright |
| 5,521,565 A * | 5/1996 | Anemogiannis ............... 333/195 |
| 6,211,600 B1 * | 4/2001 | Martin ....................... 310/313 D |
| 6,329,888 B1 * | 12/2001 | Hirota ............................ 333/193 |
| 6,504,453 B2 * | 1/2003 | Fujii .............................. 333/193 |
| 6,806,619 B2 * | 10/2004 | Nakamura et al. ......... 310/313 B |
| 2008/0315972 A1 * | 12/2008 | Mayer et al. .................. 333/193 |

FOREIGN PATENT DOCUMENTS

DE 4313981 A1 * 11/1993
JP 55066118 A * 5/1980

OTHER PUBLICATIONS

Ventura, P. et al. A New Concept in SPIDT Design: the RSPUDT (resonant SPUDT), IEEE 1994 Ultrasonic Symposium, pp. 1-6.*
P. V. Wright, "The natural single-phase unidirectional transducer: A new low-loss SAW transducer", Proc. 1985 IEEE Ultrasonics Symposium, pp. 58-63.

(Continued)

*Primary Examiner* — J. SanMartin
(74) *Attorney, Agent, or Firm* — Norris, McLaughlin & Marcus, P.A.

(57) ABSTRACT

A transducer for surface acoustic waves, and a resonator and a filter for surface acoustic waves having the transducer are provided. The transducer for surface acoustic waves has cells containing two electrode fingers per cell, wherein the transducer exhibits unidirectional behavior for propagation directions of the surface acoustic waves parallel to highly symmetrical directions of the crystal substrate. Each of two electrodes have a plurality of electrode fingers, the electrode fingers having center axes extending parallel to their longitudinal axes and being spaced apart from center axes of adjacent electrode fingers of the same electrode by a distance which equals the ratio of the velocity of the surface acoustic wave and the cut-off frequency of the transducer. The electrode fingers of both electrodes define a plurality of cells each consisting of two fingers.

24 Claims, 4 Drawing Sheets

OTHER PUBLICATIONS

Figure 1:
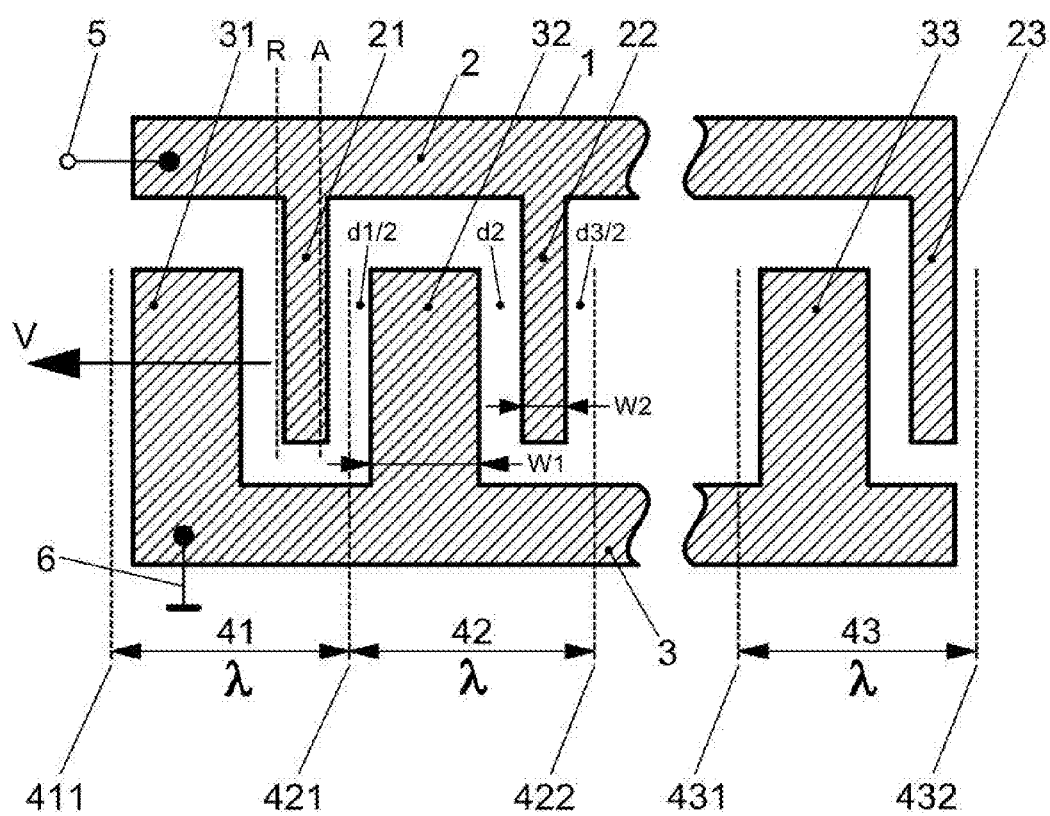

C. S. Hartmann, P. V. Wright, R. R. J. Kansy and E. M. Garber, "An analysis of SAW interdigital transducers with internal reflections and the application to the design of single-phase unidirectional transducers", Proc. 1982 IEEE Ultrasonics Symposium, pp. 40-45.

Distributed Acoustic Reflection Transducer)-Zelle (T. Kodama, H. Kawabata, Y. Yasuhara, H. Sato, "Design of Low-Loss Filters Employing Distributed Acoustic Reflection Transducers", Proc. 1986 IEEE Ultrasonics Symposium, pp. 59-64.

K. Hanma, B. Hunsinger, "A Triple Transit Suppression Technique", Proc. 1976 IEEE Ultrasonics Symposium, Seiten 328-331.

* cited by examiner

TRANSDUCER FOR SURFACE ACOUSTIC WAVES AND A RESONATOR AND A FILTER HAVING SAID TRANSDUCER

The present invention relates to a transducer for surface acoustic waves, in particular, the present invention relates to a resonator and a filter for surface acoustic waves based on the transducer according to the present invention. Further, applications for components on basis of surface acoustic waves are delay lines, oscillators and sensors.

Devices are known in the prior art composed of cells each comprising two electrode fingers (also called fingers) which comprise a modified structure of the electrode fingers in comparison to a reference transducer in order to change the unidirectional characteristics of transducers for surface acoustic waves. A cell represents an elementary component of an interdigital transducer, the cell being comprised of at least two fingers which periodically repeat in the simple case of a uniform transducer. The periodicity may, however, be disrupted due to alternating cell types. The dimension of the cell in a direction perpendicular to the longitudinal axis of the fingers equals to the wavelength of the propagating surface acoustic wave, i.e. the ratio of the velocity of the surface acoustic wave and the cut-off frequency of the transducer (also limiting frequency of the transducer). That means that a transducer for surface acoustic waves being comprised of two fingers per cell is formed such that two electrode fingers are periodically arranged in an area which represents the wavelength of the propagating surface acoustic wave.

On a crystal substrate there may exist different types of surface acoustic waves having different propagation directions and different attenuation values. For example, there exist crystal cuts having Rayleigh waves having a low attenuation and leakage waves having a high attenuation. A Rayleigh wave represents a surface acoustic wave having such a propagation velocity that the attenuation of the crystal substrate is minimal.

According to the present invention, the expression "cut-off frequency" for transducers, filters and the like is understood as the characteristic frequency of the respective component. The cut-off frequency represents a frequency having a minimal attenuation or a frequency having a maximal value of admittance, respectively. Such a frequency is unambiguously verifiable by a measurement of the admittance of the transducer depending on the frequency and therefore it represents a characteristic parameter of the respective component.

A precondition for the existence of unidirectional behaviour of interdigital transducer cells is that the distance between a centre of excitation and a centre of reflection within the same cell amounts to ±⅛ or ±⅜ of the wavelength. Accordingly, the excitation of waves is a necessary precondition for the existence of unidirectional behaviour besides the reflection of waves. According to the present invention, the expressions "centre of excitation" and "centre of reflection" are understood as a centre of excitation/reflection of the electric potential of the surface acoustic wave.

In a specific method disclosed in P. V. Wright, "The natural single-phase unidirectional transducer: A new low-loss SAW transducer", Proc. 1985 IEEE Ultrasonics Symposium, pages 58-63, in the following also referred to as [1], the unidirectional characteristics of transducers on a quartz substrate are generated by rotation of the propagation direction of the surface acoustic waves facing away from the x-axis of the crystal, wherein the cells comprise two fingers having a width of ¼ of the wavelength (i.e. both fingers have the same width) and a gap between the fingers, the gap having a width of ¼ of the wavelength. Such a device does not have unidirectional behaviour for a propagation of the surface acoustic waves in a direction of the x-axis.

In a further method disclosed in C. S. Hartmann, P. V. Wright, R. J. Kansy and E. M. Garber, "An analysis of SAW interdigital transducers with internal reflections and the application to the design of single-phase unidirectional transducers", Proc. 1982 IEEE Ultrasonics Symposium, pages 40-45, in the following also referred to as [2], unidirectional behaviour of transducers on a quartz substrate is obtained by use of a second metallization and lithographic process, wherein the transducer is comprised of cells each comprising four fingers of equal width of ⅛ of the wavelength and gaps between the fingers of a width of ⅛ of the wavelength. Due to a second process the thickness of the metallization of each second finger is greater than the thickness of each other finger located between each second finger. Therefore, surface acoustic waves are reflected on the thicker fingers and the centre of the reflection of such cells is located in the middle between two thicker fingers, i.e. in the centre of a thinner finger. The centre of excitation is located in the middle of a gap. Therefore, the distance between the centre of excitation and the centre of reflection is an odd multiple of ⅛ of the wavelength.

Furthermore, cells are known in the prior art having unidirectional behaviour, the cells comprising more than two fingers per cell, i.e. more than two fingers per wavelength. A cell-type structure having three fingers per cell is known as DART (Distributed Acoustic Reflection Transducer)-cell disclosed in T. Kodama, H. Kawabata, Y. Yasuhara, H. Sato, "Design of Low-Loss Filters Employing Distributed Acoustic Reflection Transducers", Proc. 1986 IEEE Ultrasonics Symposium, pages 59-64, in the following also referred to as [3]. Two of the three fingers are adapted to excite the wave and the third of the three fingers exclusively functions for reflection. The exciting fingers are different in their polarity, i.e. they are not connected to the same potential.

A further conventionally used cell-type structure is the Hanma-Hunsinger cell disclosed in K. Hanma, B. Hunsinger, "A Triple Transit Suppression Technique", Proc. 1976 IEEE Ultrasonics Symposium, pages 328-331, in the following also referred to as [4]. The Hunsinger cell comprises four fingers per cell which are arranged in equal groups each consisting of a small and a broad electrode finger. The electrode fingers have the same polarity within one group. However, both groups have a different polarity. According to such a cell-type structure, all fingers contribute to both, wave excitation and wave reflection.

The method described in reference [1] is disadvantageous in that the cells do not show unidirectional behaviour in case the propagation direction of the surface acoustic wave is parallel to a highly symmetrical direction of the crystal substrate such as a rotation axis or a direction being perpendicular to a reflection plane.

Furthermore<U.S. Pat. No. 3,990,023 discloses a transducer for surface acoustic waves comprising electrode fingers having different widths. However, the transducers disclosed in U.S. Pat. No. 3,990,023 are arranged symmetrically to a central line which extends parallel to the longitudinal axis of the electrode fingers and the widths of the electrode fingers are adapted such that the whole transducer structure is free of reflection. Due to the anechoic structure, there exists no centre of reflection in the respective transducer and therefore the structure disclosed in U.S. Pat. No. 3,990,023 does not show a unidirectional behaviour.

The object of the present invention is to propose a transducer for surface acoustic waves being comprised of cells each cell consisting of two electrode fingers, the transducer according to the present invention having unidirectional characteristics also for propagation directions of the surface acoustic waves being parallel to highly symmetrical directions of the crystal substrate. A further object of the invention is to complete or compensate unidirectional characteristic for such propagation directions of the surface acoustic waves, for which the unidirectional behaviour is not completely developed.

The mentioned objects are solved by the features described hereinafter. Preferred embodiments of the present invention are also described hereafter.

The transducer according to the present invention comprises a carrier substrate, the carrier substrate comprising a piezoelectric crystal or the carrier substrate comprising a crystal and a piezoelectric layer/layer system having a piezoelectric layer, a first electrode and a second electrode, wherein first and second electrodes are contactlessly arranged on the surface of the carrier substrate, wherein each of the electrodes comprises an electrode bar having a plurality of (electrode) fingers, the electrode bar of the first electrode being arranged parallel or substantially parallel to the electrode bar of the second electrode, wherein a plurality of fingers (but not necessarily all fingers) are arranged perpendicular or substantially perpendicular to the respective electrode bar, wherein a plurality of fingers (but not necessarily all fingers) of the first electrode and a plurality of fingers (but not necessarily all fingers) of the second electrode are arranged to interdigitate each other, wherein each of the electrodes comprises a plurality of fingers (but not necessarily all fingers) having a longitudinal axis being spaced apart from a longitudinal axis of an adjacent finger of the same electrode by a distance which equals the ratio of the velocity of the surface acoustic wave and the cut-off frequency of the transducer, and wherein the fingers (not necessarily all fingers) of both electrodes define a plurality of cells consisting of two fingers, each cell having a dimension extending along a direction parallel to the longitudinal direction of the bar electrodes which equals the characteristic wavelength of the transducer, wherein the plurality of these cells consists of a first finger having a first width and a second finger having a second width and the first finger and the second finger of each cell is connected with a different electrode (of the first and the second electrodes) and the first width is different from the second width.

Preferably, the number of first fingers having a first width is equal to the number of second fingers having the second width. Preferably, the transducer is asymmetrically formed with respect to a centre line which extends parallel to the longitudinal axis of the electrode fingers. Preferably, the reflection of each cell (consisting of two fingers) is greater than 0.1%, i.e. greater than 0.001. Preferably, the width of the broader fingers is lower than 0.55*λ, wherein λ represents the ratio of velocity of the surface acoustic wave and the cut-off frequency of the transducer.

Preferably, the sum of the first width, the second width and the gap between the first and the second finger of one cell is lower than the ratio of the velocity of the surface acoustic wave and the cut-off frequency of the transducer.

The widths of the fingers and distances between the fingers are adapted such that the distance between the excitation centre and the reflection centre inside one cell amounts to ±⅛ or ±⅜ of the wavelength of the transducer (ratio of the velocity of the surface acoustic wave and the cut-off frequency of the transducer). The widths of the fingers and the distances between the fingers for propagation directions of the surface acoustic waves for which the unidirectional characteristics are not completely developed, are adapted to compensate the unidirectional characteristics such that the distance between a centre of excitation (A) and a centre of reflection (R) within a cell being comprised of two adjacent fingers amounts to 0 or ±¼ or ±½ or ±¾ of the ratio of the velocity of the surface acoustic wave and the cut-off frequency of the transducer.

The propagation velocity of the surface acoustic wave, as well as, the cut-off frequency of the transducer are influenced by the crystal type of the carrier substrate, the cutting angle of the crystal, the direction of the electrode bars with respect to a rotational axis of the crystal, the structure of an optionally present layer system (including a passivation layer), the layer thickness, the width and the material of the electrode fingers.

The main idea of the present invention can be seen in that the electrode fingers of one cell are adapted to have different widths. The solution of the present invention is delimited from the cited prior art in that the transducer according to [1] does not disclose fingers having different widths, the transducer according to [2] requires an expensive two layer lithographic process with pinpoint accuracy, and [3] and [4] do not disclose a transducer having two fingers per cell but three or four fingers per cell. A transducer consisting of exactly two fingers per cell is advantageous in that the reflection factor per cell—particularly for cells on crystal substrates with a large coupling factor—is greater than that of cells having three or four fingers. Therefore, transducers having two fingers per cell with different widths can have smaller dimensions than those having cells as disclosed in the prior art and therefore such transducers can result in smaller components.

According to the present invention, an interdigital reference transducer is understood as a transducer being formed of cells having two fingers having a width of ¼ of the wavelength and a gap between the two fingers also having a width of ¼ of the wavelength.

According to the present invention, an interdigital comparative transducer is understood as a transducer which is distinguished from a transducer, according to the present invention, in terms of the width of the broad electrode finger, the width of the small electrode finger, the layer thickness, density and elastic rigidity.

Preferably, the ratio of the width of the broad finger and the width of the small finger is smaller than that of a comparative transducer when the layer thickness of the electrode material is greater and/or an electrode material having a smaller density and/or an electrode material having a greater elastic rigidity is used in comparison with the reference transducer. Preferably, the ratio of the broader electrode finger and the smaller electrode finger is greater than that of the comparative transducer when the layer thickness of the electrode material is smaller and/or an electrode material having a greater density and/or an electrode material having a lower elastic rigidity is used in comparison with a reference transducer.

The distance between the centre of excitation and the centre of reflection of an interdigital reference transducer having fingers and a gap between the fingers of ¼ of the wavelength is 0, ½ or ¼. Under these conditions, such transducers do not have a preferred direction with respect to the emitted wave amplitude if an axis which is perpendicular to the longitudinal axis of the electrode fingers is parallel to a rotation axis or perpendicular to a reflection plane of the crystal.

The object to generate perfect unidirectional characteristics is obtained if the distance between the centre of excitation and the centre of reflection within one cell amounts to ±⅛ or ±⅜ of the wavelength. Therefore, the widths of the electrode fingers of a cell are adapted according to the invention such that a broad and a small electrode finger (in terms of widths) are generated. It is explained in the following how the positions of the centre of excitation and the centre of reflection are influenced by the widths of the electrode fingers. The position of the standing potential wave within the transducer determines the position of the centre of excitation. The position of the centre of reflection is mainly determined by the small electrode finger because the amount of the reflection factor per electrode finger increases with a decreasing width of the electrode finger after running through zero for substrates having a large coupling factor while the position of the centre of reflection is mainly determined by the broad electrode finger because the reflection factor per electrode finger decreases with a decreasing electrode finger for substrates with a low coupling factor. Usually, the centre of reflection is dislocated from the centre of excitation into a direction of the broad electrode finger. The direction of increased emitted amplitude, also called forward direction, depends not only on the positions of the centre of excitation and centre of reflection, but also depends on the algebraic sign of the reflection factor, for example, in case of a reflection on the front edge of the electrode finger. The reflection factor of an electrode finger with increasing thickness of the electrode layer and increasing width runs through zero including a change in the algebraic sign for substrates with a large coupling factor. Therefore, the forward direction can invert in case of highly coupling materials in connection with an increasing layer thickness and/or an increasing width of the electrode finger.

The distance between the centres of the electrode fingers in a cell may be adapted to be larger than that of a reference transducer if the layer thickness of the electrode material is selected to be greater and/or an electrode material having a lower elastic rigidity is selected with respect to the comparative transducer. The distance between the centres of the electrode fingers in a cell may be adapted to be smaller than that of a reference transducer if the layer thickness of the electrode material is selected to be smaller and/or an electrode material having a larger elastic rigidity is selected with respect to the comparative transducer.

The reference transducer may be an interdigital transducer consisting of cells having two electrode fingers having a width of ¼ of the wavelength and a gap between the electrode fingers of a width of ¼ of the wavelength, wherein the electrode material is an aluminium layer having a relative thickness of 2% with respect to the wavelength. The propagation direction of the surface acoustic waves may be arranged to be parallel to a highly symmetrical direction of the crystal substrate such as parallel to a rotation axis or perpendicular to a reflection plane of the crystal substrate. It is, however, also possible that the propagation direction of the surface acoustic waves is not parallel with a highly symmetrical direction of the crystal substrate for which the distance between the centre of excitation and the centre of reflection in the cells of the reference transducers is unequal to 0, ±½ or ±¼ of the wavelength. In such a case, the replacement of a reference transducer (also comparative transducer) by a transducer according to the present invention may result in a distance between the centre of excitation and the centre of reflection of ±⅛ or ±⅜ of the wavelength or may result to an amount of the distance between the centre of excitation and the centre of reflection of less than 1% of the wavelength.

Aluminium as an electrode material of a comparative transducer may be replaced by copper according to the present invention. In this case, the ratio of the width of the broad electrode finger and the width of the small electrode finger has to be increased.

Preferably, fingers of the first width as well as fingers of the second width are connected which each of the electrodes. Alternatively, each electrode is exclusively connected with fingers of the first width or with fingers of the second width.

Preferably, a plurality of fingers of the first electrode and/or a plurality of fingers of the second electrode are arranged to be equidistant to each other. Preferably, all fingers of the first electrode and/or all fingers of the second electrode are arranged to be equidistant to each other. Preferably, the layer thickness of the bar electrodes and the electrode fingers are adapted to be uniform. For the case that the electrodes are connected with fingers of different widths, the dimension of a cell in a direction perpendicular to the longitudinal axis of the fingers equals the sum of the width of the first fingers of the cell, the width of the second fingers of the cell, the distance between the fingers with respect to their closest edges, the half distance between the first finger and an adjacent finger outside the cell with respect to the closest edges and the half distance between the second finger and the closest adjacent finger outside the cell with respect to the closest edges.

Preferably, the smaller the thickness of the electrode material, the greater the ratio of the second width of the second finger and the first width of the first finger. Preferably, the greater the density of the material of the electrodes, the greater the ratio of the second width of the second finger and the first width of the first finger. Preferably, the lower the elastic rigidity of the material of the electrodes, the greater the ratio of the second width of the second finger and the first width of the first finger. Preferably, the greater the layer thickness of the electrode material, the greater the distance between the centres of the electrode fingers within a cell consisting of two adjacent electrode fingers of the electrode. Preferably, the greater the elastic rigidity of the electrode material, the greater the distance between the centres of the electrode fingers within a cell consisting of two adjacent fingers of the electrode.

Preferably, the carrier substrate is selected of a material of the group: quartz ($SiO2$), lithium niobate ($LiNbO3$), zinc oxide ($ZnO$), aluminium nitride ($AlN$), gallium nitride ($GaN$), gallium orthophosphate ($GaPO4$), aluminium phosphate ($AlPO4$), langasite ([La3 Ga Ga3 (GaSi) O14]), langanite ([La3 (Ga0.5Nb0.5) Ga3 Ga2 O14]), langatate ([La3 (Ga0.5Ta0.5) Ga3 Ga2 O14]), CNGS ($Ca3NbGa3Si2O14$), CTGS ($Ca3TaGa3Si2O14$), SNGS ($Sr3NbGa3Si2O14$), STGS ($Sr3TaGa3Si2O14$), lithium tantalate ($LiTaO3$), potassium niobate ($KNbO3$), lithium tretraborate (LBO ($Li2B4O7$)) and gallium arsenide ($GaAs$).

Preferably, the longitudinal axes of the bar electrodes of the first electrode and the second electrode is arranged to be perpendicular or substantially perpendicular to a rotation axis of the crystal. Preferably, the longitudinal axes of the bar electrodes of the first electrode and the second electrode extends parallel or substantially parallel to a rotation axis of the crystal and/or perpendicular or substantially perpendicular to a reflection plane of the crystal.

Preferably, the plurality of fingers of the first electrode has the same length and the plurality of fingers of the second electrode has the same length. More preferably, all fingers have the same length.

Preferably, the number of fingers of each of the electrodes is equal. In a very preferred embodiment of the invention, the number of fingers for each of the electrodes ranges between 20 and 2000. Preferably the first electrode comprises a first contact and the second electrode comprises a second contact for supplying an AC voltage.

Preferably, the ratio of the second width and the first width is adapted such that the distance between a centre of excitation and a centre of reflection within a cell consisting of two adjacent fingers ranges between 0.115 and 0.135 or −0.135 and −0.115 or 0.365 and 0.385 or −0.385 and −0.365 (more preferably ±⅛ or ±⅜) of the ratio of the velocity of the surface acoustic wave and the cut-off frequency of the transducer.

Preferably, the ratio of second width and first width is adapted such that the distance between a centre of excitation and a centre of reflection within a cell consisting of two adjacent fingers of the electrodes ranges between −0.01 and 0.01 or 0.24 and 0.26 or −0.24 and −0.26 or 0.49 and 0.51 or −0.49 and −0.51 or 0.74 and 0.76 or −0.74 and −0.76 (more preferably 0 or ±¼ or ±½ or ±¾) of the ratio of the velocity of the surface acoustic wave and the cut-off frequency of the transducer.

Preferably, the electrodes consist of aluminium and comprise a layer thickness between 1% and 12% (more preferably between 1% and 5%) of the ratio of the velocity of the surface acoustic wave and the cut-off frequency of the transducer. Alternatively, it is preferred that the electrodes consist of copper.

Preferably, the cut-off frequency of the transducer ranges between 30 MHz and 1500 MHz (more preferably between 50 MHz and 500 MHz).

The above disclosed transducer according to the present invention may be utilized for a diversity of electronic components, in particular for a resonator, a filter, a delay line, an oscillator or a sensor.

In particular, the present invention discloses a resonator comprising: a first reflector and a second reflector, wherein a transducer according to the present invention is arranged between the two reflectors. Furthermore, the present invention discloses a filter comprising a first transducer according to the present invention (according to at least one of the above disclosed features) and a second transducer according to the present invention (according to at least one of the above disclosed features), wherein both transducers are contactlessly arranged on the carrier substrate consisting of a piezoelectric crystal and wherein the longitudinal axes of the bar electrodes of the transducers are arranged to be parallel to each other.

Embodiments of the present invention will be explained in more detail in connection with the corresponding drawings.

Figure 2:
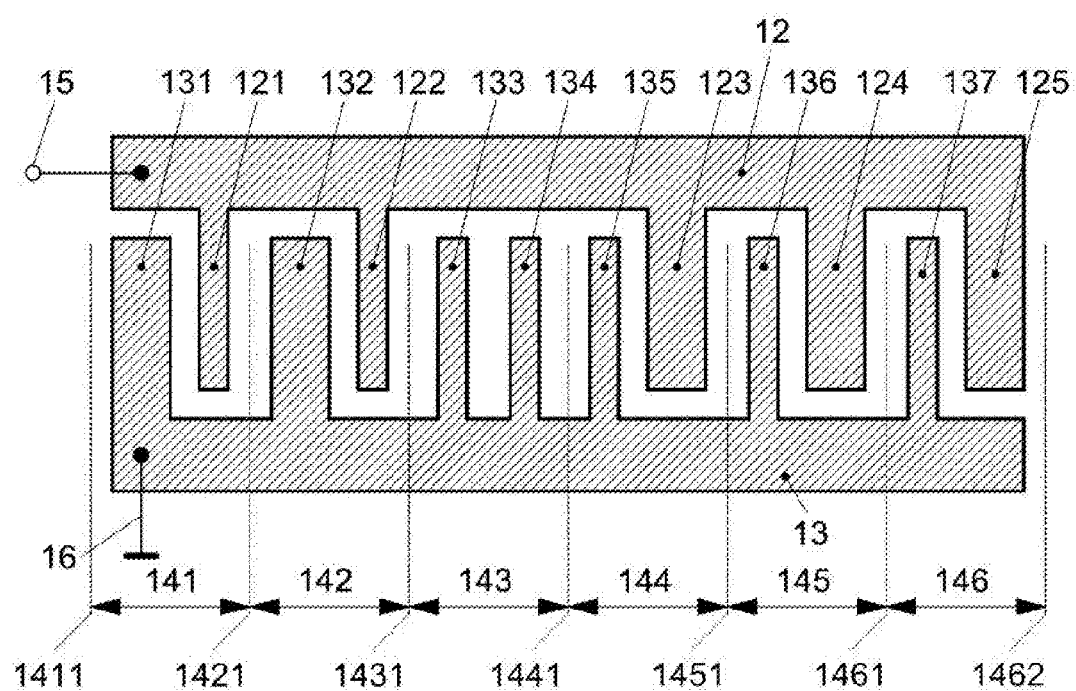
Figure 3:
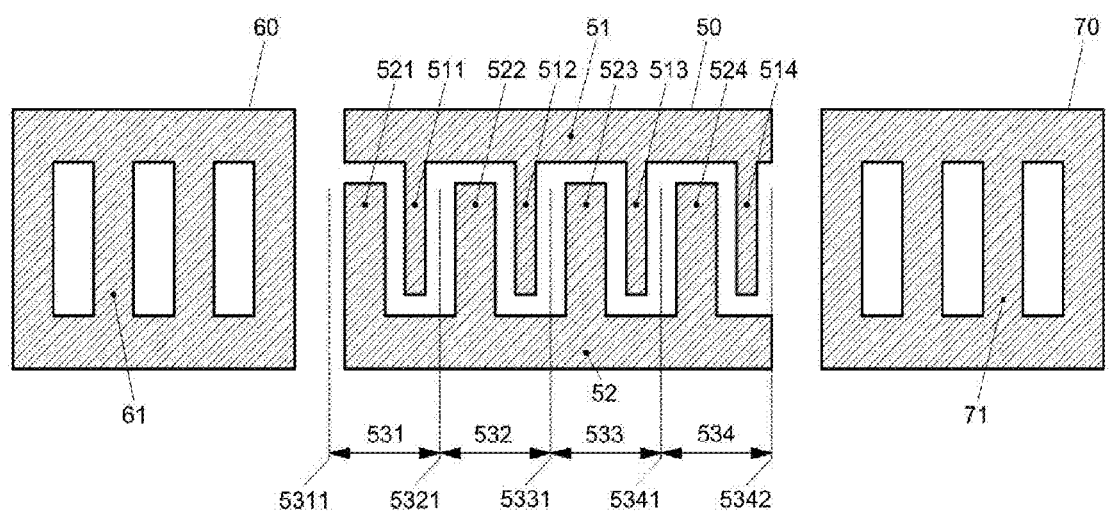
Figure 4:
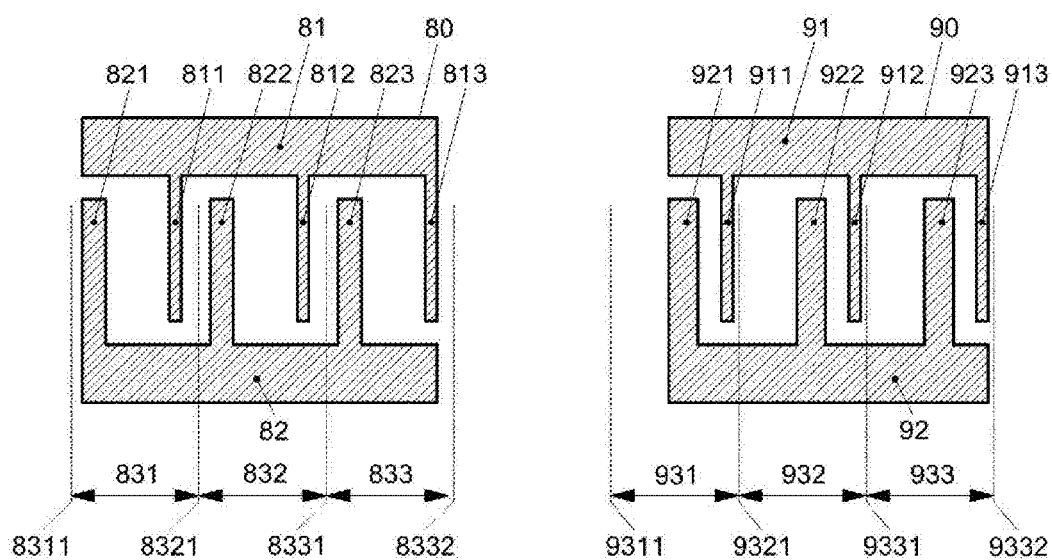

FIG. 1 shows an interdigital transducer, according to a first embodiment of the present invention, being composed of cells having two fingers of different width, wherein the small fingers are connected to one electrode and the broad fingers are connected to the other electrode, FIG. 2 shows an interdigital transducer, according to a second embodiment of the present invention, being composed of cells having two fingers of different width, wherein small and broad fingers are connected to each of the electrodes, FIG. 3 a resonator, according to the present invention, comprising an interdigital transducer according to the first embodiment, and FIG. 4 a filter, according to the present invention, comprising two interdigital transducers according to the first embodiment.

The transducers and reflectors which are contained in the drawings are depicted schematically with a number of fingers or reflector strips, respectively, which is necessary to explain the features of the present embodiments. Transducers and reflectors may however comprise much more fingers or reflector strips, respectively, than depicted in the drawings.

FIRST EMBODIMENT (FIG. 1): An interdigital transducer structure 1 is arranged on a piezoelectric substrate such as 128°YX—LiNbO3, the interdigital transducer structure 1 comprising the electrodes 2 and 3 to which the small electrode fingers 21; 22; 23 and the broad electrode fingers 31; 32; 33 are connected, respectively. A cell (41; 42; 43) consists of one broad electrode finger (31; 32; 33) and one small electrode finger (21; 22; 23). The cells 41; 42; 43 are defined in sequence by the lines 411 and 421, 421 and 422 as well as 431 and 432. Only three cells are depicted in FIG. 1. The schematically depicted discontinuation symbol between electrodes 2 and 3, however, clarifies that the depicted transducer may in reality comprise more than three cells. The position A of the centre of excitation and the position R of the centre of reflection are depicted in cell 41 for the case that 128°YX—LiNbO3 is used as a substrate material. The distance between both positions amounts to λ/8, i.e. ⅛ of the wavelength. The forward direction of a cell extends in a direction from a small to a broad electrode finger as depicted by arrow V even though the centre of reflection is located left hand of the centre of excitation. An AC voltage is applied between the connector 5 and the ground connection 6 for generating surface acoustic waves.

SECOND EMBODIMENT (FIG. 2): The transducer structure depicted in FIG. 2 comprises the electrodes 12 and 13. An AC voltage is applied between the electrode 12 via the connector 15 and the electrode 13 via the ground connection 16. The electrode fingers 121-125 are connected to the electrode 12 while the fingers 131-137 are connected to the electrode 13. The cells 141-146 are formed by each pair of two adjacent electrode fingers which are defined by the lines 1411; 1421; 1431; 1441; 1451; 1461; 1462. All cells consist of two fingers, which—except for cell 143—have different widths and are connected to different electrodes. Fingers of cell 143 have however the same width and are both connected to the electrode 13. The centres of the fingers 133 and 134 of cell 143 have a distance of one fourth of the cell length and therefore the fingers are free of reflection. Furthermore, these fingers do not excite any waves because they are connected to the same electric potential. The fingers of cells 144-146 are arranged in reverse order in comparison to cells 141 and 142. Therefore the cells 144-146 and the cells 141; 142 are distinguished by different forward directions.

THIRD EMBODIMENT (FIG. 3): FIG. 3 shows a resonator structure consisting of a transducer 50 comprising the electrodes 51 and 52, and two reflectors 60,70 which are arranged at both sides of the transducer 50. The fingers 511-514 and 521-524 are connected to electrodes 51 and 52, respectively, and cells 531-534 are defined by lines 5311; 5321; 5331; 5341; 5342. Each of the cells 531-534 comprises a broad and a small electrode finger, wherein all broad electrode fingers are connected to electrode 52 and all small electrode fingers are connected to electrode 51. The reflectors 60 and 70 are composed of reflector strips 61 and 71, respectively, the reflector strips of one reflector being short-circuited among each other.

FOURTH EMBODIMENT (FIG. 4): The structure depicted in FIG. 4 represents a filter formed of two transducers 80 and 90. Said structure is arranged on a piezoelectric substrate. The transducer 80 comprises electrodes 81 and 82. The fingers 811-813 are connected to the electrode 81 and the fingers 821-823 are connected to the electrode 82. Each of the cells 831-833 consists of two adjacent electrode fingers of different width of the transducer 80, the cells being defined by lines 8311; 8321; 8331; 8332. The transducer 90 comprises the electrodes 91; 92. The fingers 911-913 are connected to the electrode 91 and the fingers 921-923 are connected to the electrode 92. Each of the cells 931-933 consists of two adjacent fingers having different width of the transducer 90, the cells being defined by lines 9311; 9321; 9331; 9332. A direction perpendicular to the longitudinal axes of the electrode fingers 811-813, 821-823, 911-913, 921-923 and the crystal cut surface are adapted such that a transducer being only composed of cells having two fingers of the same width and a distance between the centres of the electrode fingers of the half cell length has an incomplete directivity for the emission of surface acoustic waves. The widths and positions of fingers 811; 821, 812; 822, 813; 823 in the cells 831; 832; 833 are adapted such that the transducer is characterized by a complete directivity and the forward direction of the transducer 80 is directed to the transducer 90. The widths and positions of the fingers 911; 921, 912; 922, 913; 923 in the cells 931; 932; 933 are adapted such that the transducer 90 shows no directivity.

FIFTH EMBODIMENT

A temperature sensor, wherein the resonator structure of FIG. 3 is arranged on a piezoelectric substrate, wherein the transit time of the surface acoustic wave substantially linearly depends on the temperature for a predetermined direction of the surface acoustic waves so that the resonance frequency of the resonator substantially linearly depends on the temperature. The temperature sensor comprises means for measuring the resonance frequency of the resonator and means for determining the temperature of the resonator from the measured resonance frequency.

LIST OF REFERENCE SIGNS

1, 50, 80, 90 transducer
2, 12, 51, 81, 91 first electrode
3, 13, 52, 82, 92 second electrode
5, 15 first connector
6, 16 second connector
7 piezoelectric substrate (crystal)
21-23, 121-125, 511-514, 811-813, 911-913 electrode fingers of the first electrode
31-33, 131-137, 521-524, 821-823, 921-923 electrode fingers of the second electrode
41-43, 141-146, 531-534, 831-833, 931-933 cell
411, 421, 422, 431, 432, 1411, 1421, 1431, 1441, 1451, 1461, 1462, 5311, 5321, 5331, 5341, 5342, 8311, 8321, 8331, 8332, 9311, 9321, 9331, 9332 boundaries between adjacent cells
R centre of reflection
A centre of excitation
V forward direction
W1, W2 width of electrode fingers

The invention claimed is:

1. A transducer for surface acoustic waves, comprising:
a carrier substrate arranged on a piezoelectric crystal, a first electrode and a second electrode, wherein the electrodes are arranged contactlessly to each other on the surface of the carrier substrate, and wherein each of the electrodes comprises a bar electrode having a plurality of electrode fingers, and the bar electrode of the first electrode extends parallel or substantially parallel to the bar electrode of the second electrode, and a plurality of fingers extends perpendicular or substantially perpendicular to the bar electrodes, wherein a plurality of fingers of the first electrode and a plurality of fingers of the second electrode interdigitate each other,
wherein each of the electrodes comprises a plurality of electrode fingers, each of the plurality of fingers having a centre axis being parallel to the respective longitudinal axis and being spaced apart from the centre axis of an adjacent finger of the same electrode by a distance that equals the ratio of the velocity of the surface acoustic wave and the cut-off frequency of the transducer, and the electrode fingers of both electrodes define a plurality of cells each consisting of two fingers,
wherein a plurality of said cells consists of a first finger having a first width and second finger having a second width, wherein the first finger of a cell and the second finger of the cell are connected to electrode bars of different electrodes, and the first width is different to the second width, and the ratio of second width to the first width is adapted such that the distance between a centre of excitation and a centre of reflection of one cell amounts between 0.115 and 0.135 or between −0.135 and −0.115 or between 0.365 and 0.385 or between −0.385 and −0.365 of the ratio of the velocity of the surface acoustic wave and the cut-off frequency of the transducer.

2. The transducer of claim 1, wherein the number of first fingers having a first width is equal to the number of second fingers having the second width.

3. The transducer of claim 1, wherein the transducer is asymmetrically formed with respect to a centre line which extends parallel to the longitudinal axis of the electrode fingers.

4. The transducer of claim 3, wherein the reflection of each cell is greater than 0.001.

5. The transducer of claim 1, wherein the ratio of the second width to the first width is adapted such that the distance between a centre of excitation to a centre of reflection in a cell consisting of two adjacent fingers of the electrodes amounts to ±⅛ or ±⅜ of the ratio of the velocity of the surface acoustic wave and the cut-off frequency of the transducer.

6. The transducer of claim 1, wherein each of the electrodes is connected to fingers of the first width and to fingers of the second width.

7. The transducer of claim 1, wherein each electrode is exclusively connected to fingers of the first width or exclusively connected to fingers of the second width.

8. The transducer of claim 1, wherein a plurality of fingers of the first electrode and a plurality of fingers of the second electrode are equidistantly arranged to each other.

9. The transducer of claim 8, wherein all fingers of the first electrode and all fingers of the second electrode are arranged equidistantly to each other.

10. The transducer of claim 1, wherein the layer thickness of the bar electrodes and the layer thickness of the electrode fingers of the electrodes is uniform.

11. The transducer of claim 1, wherein the carrier substrate consists of a material selected from the group of: quartz, lithium niobate, zinc oxide, aluminium nitride, gallium nitride, gallium orthophosphate, aluminium phosphate, langasite, langanite, langatate, CNGS, CTGS, SNGS, STGS, lithium tantalite, potassium niobate, lithium tretraborate and gallium arsenide, and the carrier substrate comprises a passivation layer for preventing a short-circuit.

12. The transducer of claim 1, wherein the length of the plurality of fingers of the first electrode equals to the length of the plurality of fingers of the second electrode.

13. The transducer of claim 1, wherein the number of electrode fingers for each of the electrodes amounts between 20 and 2000.

14. The transducer of claim 1, wherein the cut-off frequency of the transducer amounts between 50 MHz and 500 MHz.

15. A resonator comprising: a first reflector and a second reflector, wherein a transducer for surface acoustic waves is arranged between the reflectors, the transducer comprising:
  a carrier substrate arranged on a piezoelectric crystal, a first electrode and a second electrode, wherein the electrodes are arranged contactlessly to each other on the surface of the carrier substrate, and wherein each of the electrodes comprises a bar electrode having a plurality of electrode fingers, and the bar electrode of the first electrode extends parallel or substantially parallel to the bar electrode of the second electrode, and a plurality of fingers extends perpendicular or substantially perpendicular to the bar electrodes, wherein a plurality of fingers of the first electrode and a plurality of fingers of the second electrode interdigitate each other,
  wherein each of the electrodes comprises a plurality of electrode fingers, each of the plurality of fingers having a centre axis being parallel to the respective longitudinal axis and being spaced apart from the centre axis of an adjacent finger of the same electrode by a distance that equals the ratio of the velocity of the surface acoustic wave and the cut-off frequency of the transducer, and the electrode fingers of both electrodes define a plurality of cells each consisting of two fingers,
  wherein a plurality of said cells consists of a first finger having a first width and second finger having a second width, wherein the first finger of a cell and the second finger of the cell are connected to electrode bars of different electrodes, and the first width is different to the second width, and the ratio of second width to the first width is adapted such that the distance between a centre of excitation and a centre of reflection of one cell amounts between 0.115 and 0.135 or between −0.135 and −0.115 or between 0.365 and 0.385 or between −0.385 and −0.365 of the ratio of the velocity of the surface acoustic wave and the cut-off frequency of the transducer.

16. The resonator of claim 15, wherein the number of first fingers having a first width is equal to the number of second fingers having the second width.

17. The resonator of claim 15, wherein the transducer is asymmetrically formed with respect to a centre line which extends parallel to the longitudinal axis of the electrode fingers.

18. The resonator of claim 17, wherein the reflection of each cell is greater than 0.001.

19. The resonator of claim 15, wherein the ratio of the second width to the first width is adapted such that the distance between a centre of excitation to a centre of reflection in a cell consisting of two adjacent fingers of the electrodes amounts to $\pm 1/8$ or $\pm 3/8$ of the ratio of the velocity of the surface acoustic wave and the cut-off frequency of the transducer.

20. A filter comprising a first transducer for surface acoustic waves and a second transducer for surface acoustic waves, wherein each transducer is arranged contactlessly on a carrier substrate consisting of a piezoelectric crystal and wherein longitudinal axes of bar electrodes of the transducers extend parallel to each other, wherein each transducer comprises:
  a carrier substrate arranged on a piezoelectric crystal, a first electrode and a second electrode, wherein the electrodes are arranged contactlessly to each other on the surface of the carrier substrate, and wherein each of the electrodes comprises a bar electrode having a plurality of electrode fingers, and the bar electrode of the first electrode extends parallel or substantially parallel to the bar electrode of the second electrode, and a plurality of fingers extends perpendicular or substantially perpendicular to the bar electrodes, wherein a plurality of fingers of the first electrode and a plurality of fingers of the second electrode interdigitate each other,
  wherein each of the electrodes comprises a plurality of electrode fingers, each of the plurality of fingers having a centre axis being parallel to the respective longitudinal axis and being spaced apart from the centre axis of an adjacent finger of the same electrode by a distance that equals the ratio of the velocity of the surface acoustic wave and the cut-off frequency of the transducer, and the electrode fingers of both electrodes define a plurality of cells each consisting of two fingers,
  wherein a plurality of said cells consists of a first finger having a first width and second finger having a second width, wherein the first finger of a cell and the second finger of the cell are connected to electrode bars of different electrodes, and the first width is different to the second width, and the ratio of second width to the first width is adapted such that the distance between a centre of excitation and a centre of reflection of one cell amounts between 0.115 and 0.135 or between −0.135 and −0.115 or between 0.365 and 0.385 or between −0.385 and −0.365 of the ratio of the velocity of the surface acoustic wave and the cut-off frequency of the transducer.

21. The filter of claim 20, wherein the number of first fingers having a first width is equal to the number of second fingers having the second width.

22. The filter of claim 20, wherein the transducer is asymmetrically formed with respect to a centre line which extends parallel to the longitudinal axis of the electrode fingers.

23. The filter of claim 22, wherein the reflection of each cell is greater than 0.001.

24. The filter of claim 20, wherein the ratio of the second width to the first width is adapted such that the distance between a centre of excitation to a centre of reflection in a cell consisting of two adjacent fingers of the electrodes amounts to $\pm 1/8$ or $\pm 3/8$ of the ratio of the velocity of the surface acoustic wave and the cut-off frequency of the transducer.

* * * * *